(12) United States Patent
Ackerman

(10) Patent No.: US 6,404,241 B1
(45) Date of Patent: Jun. 11, 2002

(54) CURRENT-MODE PEAK DETECTOR

(75) Inventor: Jay Ackerman, Greeley, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/482,291

(22) Filed: Jan. 13, 2000

(51) Int. Cl.$^7$ .............................................. G01R 19/00
(52) U.S. Cl. ............................ 327/58; 327/62; 327/543
(58) Field of Search .............................. 327/58, 60, 52, 327/538, 543, 77, 78; 323/315

(56) References Cited

U.S. PATENT DOCUMENTS

| | | | | |
|---|---|---|---|---|
| 5,465,067 A | * | 11/1995 | Anderson | 327/309 |
| 5,512,849 A | * | 4/1996 | Wong | 327/77 |
| 3,979,606 A | * | 9/1998 | Ahmed | 327/78 |
| 5,801,581 A | * | 9/1998 | Koizumi | 327/538 |

* cited by examiner

Primary Examiner—Terry D. Cunningham
Assistant Examiner—Hai L. Nguyen
(74) Attorney, Agent, or Firm—Suiter & Associates

(57) ABSTRACT

A current-mode peak detector circuit is disclosed. The current-mode peak detector circuit includes an input transistor for receiving an input current that impresses a voltage on a control node, a pair of transistors for providing an output current in response to the voltage at the control node, and a decay control circuit for controlling the decay of the voltage at the control node such that the output current is representative of a peak value of the input current signal. A clamp circuit may be provided for clamping the input voltage to a predetermined level. All of the elements of the current-mode peak detector circuit may be realized using transistors for facilitating integration of the current-mode peak detector circuit on an integrated circuit. It is emphasized that this abstract is provided to comply with the rules requiring an abstract that will allow a searcher or other researcher to quickly ascertain the subject matter of the technical disclosure. It is submitted with the understanding that it will not be used to interpret or limit the scope or meaning of the claims.

21 Claims, 2 Drawing Sheets

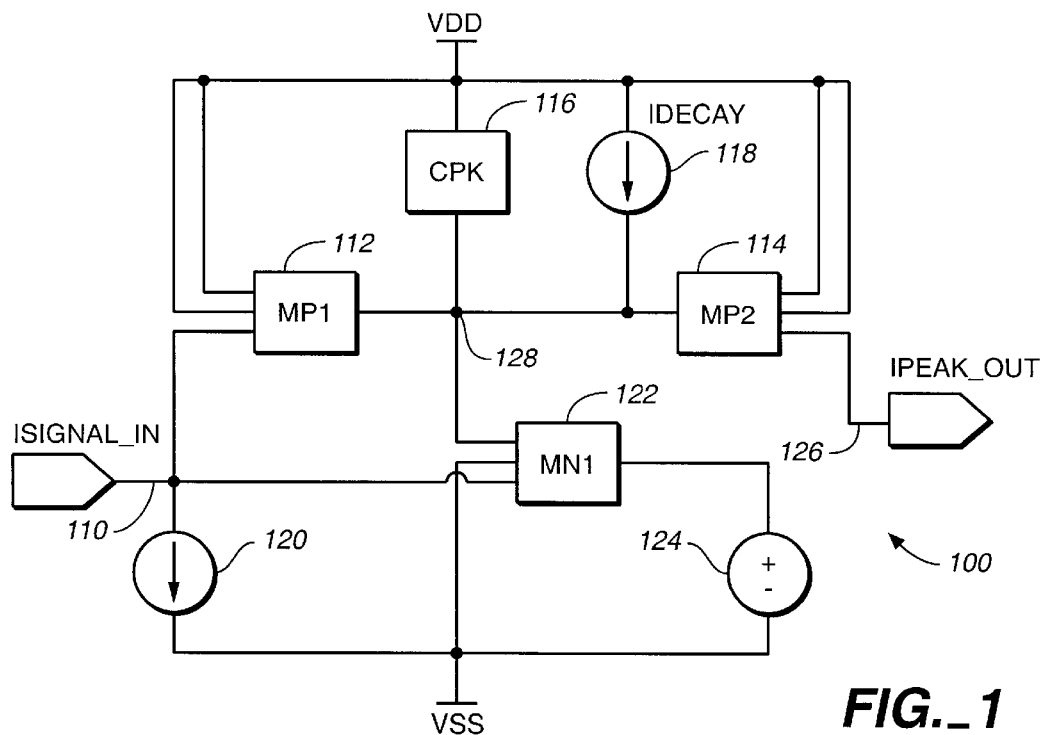
FIG._1
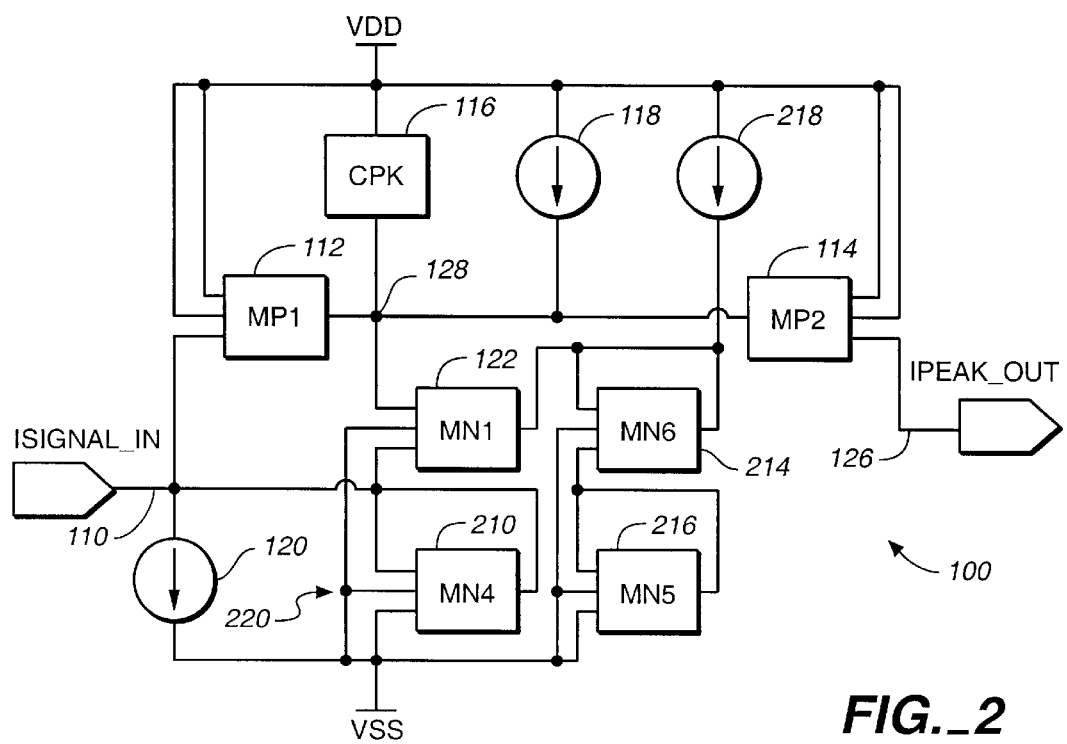
FIG._2

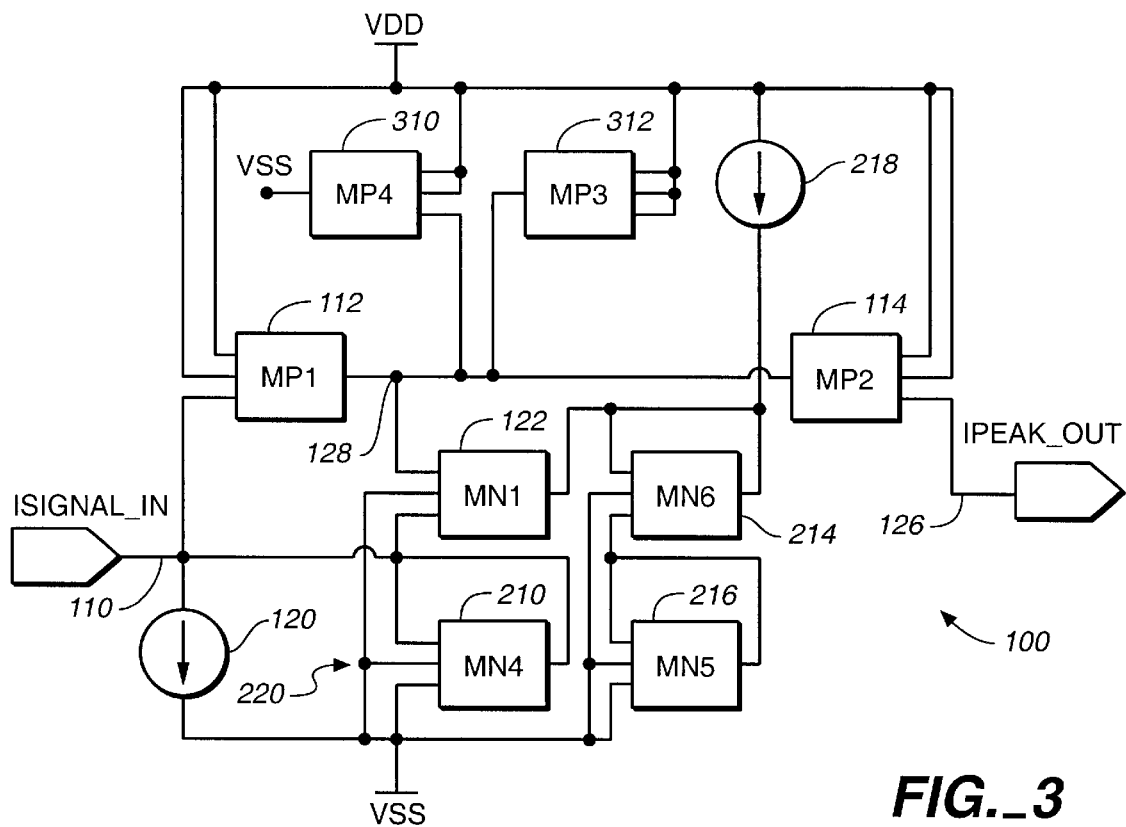
FIG._3

CURRENT-MODE PEAK DETECTOR

BACKGROUND

Processing of electronic signals has been traditionally accomplished in the voltage domain. In the voltage domain, the input and outputs of a circuit operate in the voltage mode and in general respond the voltage values of an applied input signal. However, there lies a need in electronic circuits to provide a design having higher operational speeds and lower power consumption. Circuits that are optimized to respond to voltage signals can be limited in optimization of higher speed and lower power consumption. Thus, there lies a need for circuits that operate in a current mode being optimized to be responsive to current values of an electrical signal rather than to voltage values in order to attain better operating characteristics in certain circuit designs. In a typical peak detector circuit, the circuit is designed to be responsive to a peak voltage value of an input signal. The circuit provides an output voltage representative of the peak value of the input circuit. Peak detector circuits are used, for example, in demodulation of amplitude-modulated (AM) or frequency-modulated (FM) signals. However, there lies a need to provide a circuit that is capable of being responsive to the peak current value of an input signal to realize a higher-speed, lower power current-mode peak detector.

BRIEF DESCRIPTION OF THE DRAWINGS

The numerous advantages of the present invention may be better understood by those skilled in the art by reference to the accompanying figures in which:

FIG. 1 is a schematic diagram of a current-mode peak detector circuit in accordance with the present invention.

FIG. 2 is a schematic diagram of the current-mode peak detector circuit of FIG. 1 wherein a clamping circuit is utilized; and FIG. 3 is a schematic diagram of the current-mode peak detector of FIG. 1 wherein a clamping circuit is utilized and wherein the circuit is realized using transistors.

DETAILED DESCRIPTION

Reference will now be made in detail to the presently preferred embodiment of the invention, an example of which is illustrated in the accompanying drawings.

Referring now to FIG. 1, a current-mode peak detector circuit in accordance with the present invention will be discussed. In general, a peak detector detects the peak value of a signal. After a peak, the signal will generally decay at a rate set by a current and a capacitor. The current-mode peak detector 100 of FIG. 1 works in the following manner. The input signal current (ISIGNAL_IN) is pulled out of node 110 and is represented by current source 120. The action of current source 120 turns on transistor 122 (MN1) and pulls the node 128 down (i.e., the voltage at node 128 is decreased) until the current in transistor 112 and the input signal current are approximately equal, neglecting the decay current, IDECAY, from current source 118. Transistor 122 is biased with bias voltage source 124. In one embodiment, transistors 112 (MP1) and 114 (MP2) are selected or designed to have the same channel width to channel length (W/L) ratio such that their gate-source voltages are the same (for example, in the case where transistors 112 and 114 are field-effect transistors), and the current flowing through transistors 112 and 114 will also be the same. Therefore, the current in transistor 114 is equal to the input signal current at node 110. When the input signal current at node 110 is reduced, the voltage at node 110 will tend to increase until transistor 122 turns off. However, the voltage at node 128 is held by capacitor 116 (CPK), with a decay current source 118 (IDECAY). Capacitor 116 and current source 118 form a decay control circuit for maintaining the output current flowing through node 126 at a value representative of the peak value of the input current signal at node 110. The peak value of the input signal at node 110 is represented at node 126 as output IPEAK_OUT as an output of current-mode peak detector circuit 100. In one embodiment of the present invention, transistors 114 and 116 are p-channel metal-oxide-semiconductor field-effect transistors (MOSFETs), and transistor 122 is an n-channel MOSFET.

Referring now to FIG. 2, the current-mode peak detector circuit of FIG. 1 is shown having a clamping circuit on the input. In the embodiment of FIG. 2, a clamping circuit 220 is used on node 110 of current-mode peak detector circuit 100 to prevent large signal swings at this node. The clamping function of clamping circuit 220 improves the frequency response and accuracy of current-model peak detector circuit 100. The clamping circuit may be realized with transistors 122, 210, 214, and 216 and current source 218. Further, bias voltage source 124 may be replaced by transistors 214 and 216 and current source 218. In one embodiment of the present invention, transistors 210, 214, and 216 are n-channel MOSFETs.

Referring now to FIG. 3, an alternative embodiment of the current-mode peak detector circuit of FIG. 1 will be discussed. As shown in FIG. 3, current source 118 and capacitor 116 of FIG. 1 can be realized with transistors 310 and 312 to facilitate the construction of peak-mode current source on an integrated circuit. In one embodiment of the invention, transistors 310 and 312 are p-channel MOSFETs. In an alternative embodiment of current-mode peak detector circuit 100, other types of transistors may be utilized as substitutes for transistors 112, 114, 122, 210, 214, 216, 310, or 312 without resulting in any substantial change to the function of current-mode peak detector circuit 100. For example, the n-channel MOSFETs may be substituted with npn bias-junction transistors (BJTs), and the p-channel MOSFETs may be substituted with pnp BJTs. Alternatively, other types of field-effect transistors may be substituted for the MOSFET transistors as well.

It is believed that the current-mode peak detector of the present invention and many of its attendant advantages will be understood by the forgoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. An apparatus, comprising:
   a first transistor for receiving an input current signal at an input node;
   second and third transistors coupled to said first transistor at a control node such that a voltage at the control node is representative of the value of the input current signal; and
   a control circuit coupled to the control node for controlling the decay of the voltage at the control node such that an output current signal is provided from one of said second and third transistors being representatative of a peak value of the input current signal.

2. An apparatus as claimed in claim 1, said second and third transistors each having a channel width to channel length ratio comparable to the other of said second and third transistors such that current flowing in one of said second and third transistors is comparable to current flowing in the other of said second and third transistors.

3. An apparatus as claimed in claim 1, said control circuit comprising a capacitor and a current source coupled in parallel.

4. An apparatus as claimed in claim 1, said control circuit comprising fourth and fifth transistors coupled in parallel.

5. An apparatus as claimed in claim 1, further comprising a clamp circuit coupled to the input node.

6. An apparatus as claimed in claim 1, said first, second and third transistors being MOSFET transistors.

7. An apparatus as claimed in claim 1, said first transistor being an n-channel MOSFET transistor and said second and third transistors being p-channel MOSFET transistors.

8. An apparatus as claimed in claim 1, said clamp circuit comprising at least one or more transistors.

9. An apparatus, comprising:

means for receiving an input current signal at an input node;

means, coupled to said receiving means at a control node, for controlling a voltage at the control node such that the voltage at the control node is representative of the value of the input current signal; and means, coupled to the control node, for controlling the decay of the voltage at the control node such that an output current signal is provided from said voltage controlling means being representatative of a peak value of the input current signal.

10. An apparatus as claimed in claim 9, said decay controlling means comprising means for providing a capacitance and means for providing a constant current coupled in parallel.

11. An apparatus as claimed in claim 9, further comprising means for clamping a voltage appearing at the input node.

12. An apparatus as claimed in claim 9, said receiving means comprising at least one or more transistors.

13. An apparatus as claimed in claim 9, said voltage controlling means comprising at least one or more transistors.

14. An apparatus as claimed in claim 9, said decay controlling means comprising at least one or more transistors.

15. An apparatus as claimed in claims 11, said clamping means comprising at least one or more transistors.

16. An apparatus as claimed in claim 9, said receiving means, said voltage controlling means, and said decay controlling means being integrated on an integrated circuit.

17. A method comprising:

receiving an input current signal at an input node;

turning on a first transistor coupled to the input node in response to said receiving step;

controlling with the first transistor a voltage at a control node such that a current flowing in a second transistor coupled to the control node is comparable to a current flowing through a third transistor coupled to the control node;

controlling a decay of the voltage at the control node such that an output current may be obtained from at least one of the second and third transistors wherein the output current is representative of a peak value of the input current signal at the input node.

18. A method as claimed in claim 17, further comprising the step of clamping a voltage at the input node to a predetermined value.

19. A method as claimed in claim 17, said decay controlling step being implemented with a capacitor and a current source.

20. A method as claimed in claim 17, said decay controlling step being implemented with fourth and fifth transistors.

21. A method as claimed in claim 17, said controlling step including the step of controlling the decay of the voltage at the control node according to a selected frequency of the input current signal.

\* \* \* \* \*